US008993436B2

(12) United States Patent
Ko et al.

(10) Patent No.: US 8,993,436 B2
(45) Date of Patent: Mar. 31, 2015

(54) METHOD FOR FABRICATING SEMICONDUCTOR DEVICE THAT INCLUDES FORMING PASSIVATION FILM ALONG SIDE WALL OF VIA HOLE

(71) Applicant: Samsung Electronics Co., Ltd., Suwon-si Gyeonggi-do (KR)

(72) Inventors: Dong-Whan Ko, Suwon-si (KR); Jong-Sam Kim, Hwaseong-si (KR); Hong-Jae Shin, Seoul (KR); Seung-Il Bok, Seoul (KR); Sae-Il Son, Suwon-si (KR); Woo-Jin Jang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/199,031

(22) Filed: Mar. 6, 2014

(65) Prior Publication Data

US 2014/0308810 A1    Oct. 16, 2014

(30) Foreign Application Priority Data

Apr. 10, 2013    (KR) .................. 10-2013-0039463

(51) Int. Cl.
*H01L 21/475* (2006.01)
*H01L 21/768* (2006.01)

(52) U.S. Cl.
CPC ........ *H01L 21/76832* (2013.01); *H01L 21/475* (2013.01); *H01L 21/76813* (2013.01); *H01L 21/76831* (2013.01)
USPC ............................ 438/639; 438/696; 438/740

(58) Field of Classification Search
USPC ........................................... 438/740
See application file for complete search history.

(56) References Cited

U.S. PATENT DOCUMENTS

| | | | |
|---|---|---|---|
| 6,197,696 B1 | 3/2001 | Aoi | |
| 6,358,842 B1 * | 3/2002 | Zhou et al. | 438/633 |
| 6,468,898 B1 | 10/2002 | Usami | |
| 6,696,222 B2 | 2/2004 | Hsue et al. | |
| 7,550,822 B2 * | 6/2009 | Lee et al. | 257/637 |
| 7,767,578 B2 | 8/2010 | Huang et al. | |
| 7,781,154 B2 | 8/2010 | Parikh | |
| 7,968,506 B2 | 6/2011 | Chou et al. | |
| 8,048,811 B2 | 11/2011 | Feustel et al. | |
| 8,110,342 B2 | 2/2012 | Liu et al. | |
| 2003/0224595 A1 * | 12/2003 | Smith et al. | 438/637 |
| 2007/0082489 A1 * | 4/2007 | Tsao et al. | 438/689 |
| 2011/0175233 A1 | 7/2011 | Ueki | |

FOREIGN PATENT DOCUMENTS

| | | |
|---|---|---|
| JP | 2010-129950 | 6/2010 |
| KR | 10-2007-0014695 A | 2/2007 |
| KR | 10-2007-0066460 A | 6/2007 |

* cited by examiner

*Primary Examiner* — Stephen W Smoot
(74) *Attorney, Agent, or Firm* — Lee & Morse, P.C.

(57) ABSTRACT

A method for fabricating a semiconductor device includes sequentially forming an etch stop film and an insulating film on a substrate including a lower pattern forming a conductive mask pattern including a first opening on the insulating film, forming a via-hole in the insulating film using the conductive mask pattern as an etch mask, the via-hole exposing the etch stop film, removing the conductive mask pattern, and forming a passivation film along a side wall of the via-hole after removing the conductive mask pattern.

19 Claims, 8 Drawing Sheets

METHOD FOR FABRICATING SEMICONDUCTOR DEVICE THAT INCLUDES FORMING PASSIVATION FILM ALONG SIDE WALL OF VIA HOLE

CROSS-REFERENCE TO RELATED APPLICATION

Korean Patent Application No. 10-2013-0039463, filed on Apr. 10, 2013, in the Korean Intellectual Property Office, and entitled: "Method For Fabricating Semiconductor Device," is incorporated by reference herein in its entirety.

BACKGROUND

1. Field

Embodiments relate to a method of fabricating a semiconductor device.

2. Description of the Related Art

Recently, with the development of electronic technology, down-scaling of semiconductor devices has proceeded rapidly, and devices with high integration and lower power consumption of semiconductor chips have been in demand.

SUMMARY

Embodiments are directed to a method for fabricating a semiconductor device including sequentially forming an etch stop film and an insulating film on a substrate including a lower pattern, forming a conductive mask pattern including a first opening on the insulating film, forming a via-hole in the insulating film using the conductive mask pattern as an etch mask, the via-hole exposing the etch stop film, removing the conductive mask pattern, and forming a passivation film along a side wall of the via-hole after removing the conductive mask pattern.

The passivation film may include a carbon-based polymer.

The passivation film may be formed using a plasma process.

The method may further include exposing the lower pattern by removing a portion of the etch stop film that overlaps the via-hole after forming the passivation film.

Removing the conductive mask pattern and exposing the lower pattern may be performed in-situ.

The insulating film may include an upper insulating film and a lower insulating film. Exposing the lower pattern may include removing the exposed etch stop film using the upper insulating film as an etch mask.

The method may further include conformally forming a barrier layer along the side wall of the via-hole, and forming a conductive film that fills the via-hole on the barrier layer.

Forming the via-hole may include forming a photosensitive film pattern that includes a second opening that entirely overlaps the first opening, the second opening having a width that is narrower than a width of the first opening, forming a first trench in the insulating film using the photosensitive film pattern as an etch mask, and forming a second trench in the insulating film using the conductive mask pattern as the etch mask after removing the photosensitive film pattern, the second trench not exposing the etch stop film.

The via-hole may be formed in a region that corresponds to the first trench when the second trench is formed.

The passivation film may be formed along a side wall and a bottom surface of the second trench and a side wall of the via-hole.

The conductive mask pattern may include a third opening spaced apart from the first opening. Forming the via-hole may include forming a third trench in the insulating film that corresponds to the third opening when the second trench is formed, the third trench not exposing the etch stop film.

The lower pattern may include a conductive material.

Embodiments are also directed to a method for fabricating a semiconductor device including sequentially forming an etch stop film and an insulating film on metal wirings, forming a conductive mask pattern including a first opening on the insulating film, the first opening exposing an upper surface of the insulating film, forming a first trench in a part of the exposed upper surface of the insulating film, the first trench not exposing the etch stop film, forming a second trench and a via-hole a region that corresponds to the first trench in the insulating film through etching using the conductive mask pattern, the via hole exposing the etch stop film and the second trench not exposing the etch stop film, forming a passivation film along a side wall and a bottom surface of the second trench and a side wall of the via-hole after removing the conductive mask pattern, and exposing the metal wirings by removing the exposed etch stop film exposed by the via hole after forming the passivation film.

Forming the passivation film may include forming a carbon-based polymer using a plasma process.

Removing the conductive mask pattern, forming the passivation film, and exposing the metal wirings may be performed in-situ.

Embodiments are also directed to a method for fabricating a semiconductor device including a substrate including a lower wiring embedded therein, forming an etch stop film on the substrate such that the etch stop film covers the lower wiring, forming an insulating film on the etch stop film, sequentially forming a conductive mask pattern on the insulating film, the conductive mask pattern including a first opening that exposes the insulating film at a location where the insulating film overlaps the lower wiring and a second opening spaced apart from the first opening, the second opening exposing the insulating film at a location where the insulating film does not overlap the lower wiring, forming a photosensitive film pattern on the insulating film and the conductive mask pattern, the photosensitive film partially filling the first opening to create a third opening overlapping the first opening, the third opening exposing the insulating film and having a narrower diameter than the first opening, forming a first trench in the insulating film using the photosensitive film pattern as an etch mask, the first trench not exposing the etch stop film, removing photosensitive film pattern, forming a second trench corresponding to the first opening of the conductive mask pattern, the second trench not exposing the etch stop film, a third trench corresponding to the second opening of the conductive mask pattern, the third trench not exposing the etch stop film, and a via-hole that extends from the first trench to expose the etch stop film at the location where the insulating film overlaps the lower wiring, removing the conductive mask pattern, and forming a passivation layer along a side wall and bottom surface of the second trench, along a side wall and a bottom surface of the third trench, and along a side wall of the via-hole.

The method may further include removing the etch stop film exposed in the first trench to expose the lower wiring.

The method may further include forming a barrier film conformally along the sidewall and bottom surface of the second trench, along the sidewall and bottom surface of the third trench, and along the side wall of the via-hole.

The method may further include forming a via and upper wiring by filling the via-hole, second trench, and third trench with a conductive material.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings thereof.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the relevant art. It is noted that the use of any and all examples, or exemplary terms provided herein is intended merely to better illuminate and is not a limitation on the scope thereof the invention. Further, unless defined otherwise, all terms defined in generally used dictionaries may not be overly interpreted.

Hereinafter, referring to FIGS. 1 to 6, a method for fabricating a semiconductor device according to an embodiment will be described.

FIGS. 1 to 6 illustrate views of intermediate stages of a method of fabricating a semiconductor device according to an embodiment.

Figure 1:
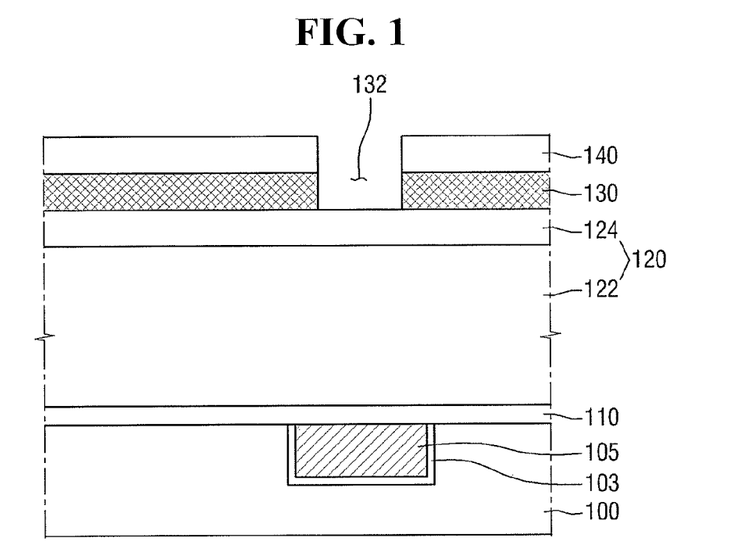
FIGS. 1 to 6 illustrate views of intermediate stages of a method of fabricating a semiconductor device according to an embodiment.

Referring to FIG. 1, a first etch stop film 110 and a first insulating film 120 may be sequentially formed on a substrate 100 including a lower pattern 105. First mask patterns 130 and 140, which include a first opening 132, may be formed on the first insulating film 120.

The lower pattern 105 may be formed on the substrate 100. The substrate 100 may have a structure in which a base substrate and an epitaxial layer are laminated, as an example. The substrate 100 may be a silicon substrate, a gallium arsenide substrate, a silicon germanium substrate, a ceramic substrate, a quartz substrate, a glass substrate for display, or an SIO (Semiconductor On Insulator) substrate, as examples. Hereinafter, a silicon substrate is exemplified. Further, the substrate 100 may be in a form in which an insulating film is formed on the silicon substrate.

In a method for fabricating a semiconductor device according to embodiments, it is described that the lower pattern 105 corresponds to metal wirings. In other implementations, the lower pattern 105 may be a transistor or a diode that is formed in the substrate 100. For example, the lower pattern 105 may be a gate electrode of a transistor or a source/drain of the transistor.

The lower pattern 105 that is included in the substrate 100 may include a conductive material. The lower pattern 105 may include, for example, aluminum (Al), copper (Cu), tungsten (W), or a combination thereof.

A lower barrier film 103 may be formed between the lower pattern 105 and the substrate 100. The lower barrier film 103 may be conformally formed along a recess in the substrate 100. The lower barrier film 103 may include, for example, a material, such as Ta, TaN, Ti, TiN, Ru, Co, Ni, NiB, or WN. Although the lower barrier layer 103 is illustrated as a single layer, in other implementations, the lower battier layer 103 may include multiple layers.

The first etch stop film 110 may be formed on the substrate including the lower pattern 105. The first etch stop film 110 may serve as a capping film that protects the lower pattern 105. The first etch stop film 110 may include, for example, silicon nitride, silicon oxynitride, or silicon carbonitride. The first etch stop film 110 may be formed using, for example, a chemical vapor deposition or an atomic layer deposition. Hereinafter, it is exemplified that the first etch stop film 110 includes silicon carbonitride (SiCN).

The first insulating film 120 may be formed on the first etch stop film 110. The first insulating film 120 may include a first lower insulating film 122 and a first upper insulating film 124. The first lower insulating film 122 and the first upper insulating film 124 may include at least one of an oxide, a nitride, and an oxynitride. Further, the first lower insulating film 122 and the first upper insulating film 124 may include a low-k material to reduce a coupling phenomenon between wirings. The low-k material may include, for example, FOX (Flowable Oxide), TOSZ (Tonen Silazene), USG (Undoped Silica Glass), BSG (Borosilica Glass), PSG (PhosphoSilica Glass), BPSG (BoroPhosphoSilica Glass), PRTEOS (Plasma Enhanced Tetra Ethyl Ortho Silicate), FSG (Fluoride Silicate Glass), CDO (Carbon Doped Silicon Oxide), Xerogel, Aerogel, Amorphous Fluorinated Carbon, OSG (Organo Silicate Glass), Parylene, BCB (bis-benzocyclobutenes), or a combination thereof.

The first insulating film 120 may be formed using, for example, chemical vapor deposition, spin coating, PECVD (Plasma Enhanced CVD), or HDP-CVD (High Density Plasma CVD).

The first insulating film 120 may include a material having an etch selectivity for the first etch stop film 110. Hereinafter, it is exemplified that the first lower insulating film 122 includes a low-k material, and the first upper insulating film 124 includes silicon oxynitride (SiON).

The first mask patterns 130 and 140 may be formed on the first insulating film 120. The first mask patterns 130 and 140 may include the first lower mask pattern 130 and the first upper mask pattern 140. The first lower mask pattern 130 that constitutes the first mask pattern may be, for example, a conductive mask pattern. The first lower mask pattern 130 may include, for example, at least one of titanium nitride (TiN), titanium (Ti), tantalum (Ta), tantalum nitride (TaN), tungsten (W), and aluminum (Al). The first upper mask pattern 140 may include, for example, at least one of an oxide, a nitride, and an oxynitride. Hereinafter, it is exemplified that the first upper mask pattern 140 includes the same material as the first upper insulating film 124.

The first lower mask film and the first upper mask film are sequentially formed on the first insulating film 120. In order to pattern the first upper mask film, a photosensitive film pattern may be formed on the first upper mask film. In a photo process, the first upper mask film may be, for example, a reflection prevention film. Thereafter, the first upper mask pattern 140 may be formed using the photosensitive film pattern as an etch mask. After the photosensitive film pattern is removed, the first lower mask pattern 130 that includes the first opening 132 may be formed using the first upper mask pattern 140 as an etch mask. In other implementations, the first upper mask pattern 140 and the first lower mask pattern 130 may be simultaneously formed using the photosensitive film pattern formed on the first upper mask film as an etch mask.

The first opening 132 may expose the first insulating film 120, specifically, the first upper insulating film 124. FIG. 1 illustrates that the first opening 132 exposes the upper surface of the first upper insulating film 124. In other implementations, a part of the first upper insulating film 124 may be recessed.

Figure 2:
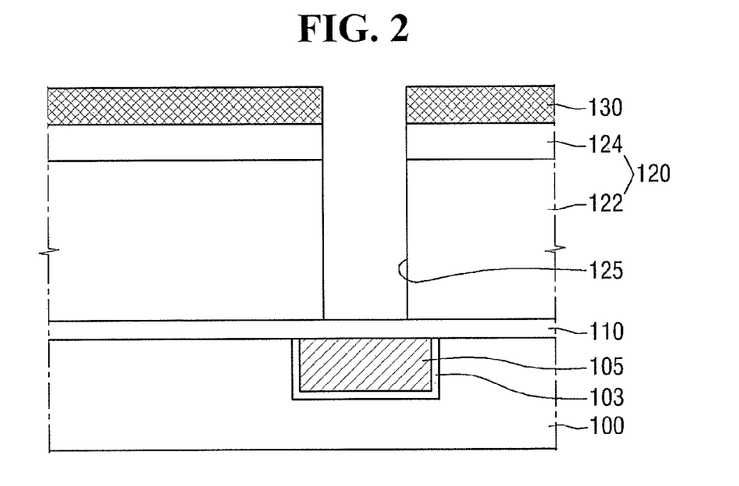

Referring to FIG. 2, a first via-hole 125 may be formed in the first insulating film 120 using the first lower mask pattern 130 as an etch mask. The first via-hole 125 may expose the first etch stop film 110 that is on the lower portion of the first insulating film 120. The first via-hole 125 may be formed to penetrate the first insulating film 120.

The first via-hole 125 may be formed in the first insulating film 120 by etching the first insulating film 120 (for example, the first upper insulating film 124 and the first lower insulating film 122) that is exposed through the first opening 132. The etching process to form the first via-hole 125 may be stopped at the first etch stop film 110. Thereby, the first via hole 125 may expose the first etch stop film 110.

The etching process to form the first via-hole 125 may be, for example, a dry etching process.

When the first via-hole 125 is formed, the first upper mask pattern 140 that is formed on the first lower mask pattern 130 may also be etched to be removed. In the method for fabricating a semiconductor device according to an embodiment, it is described that the first upper mask pattern 140 is removed in the etching process to form the first via-hole 125. In other implementations, the first upper mask pattern 140 may be removed after the first lower mask pattern 130 is formed as shown in FIG. 1.

Figure 3:
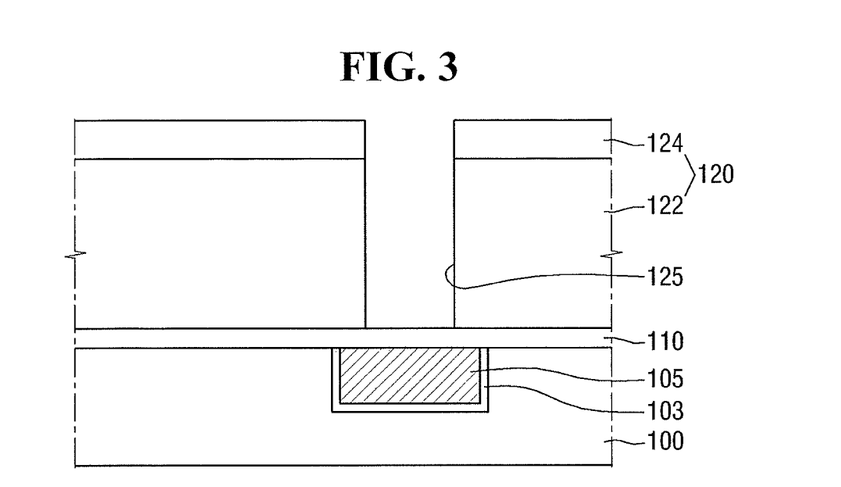

Referring to FIG. 3, the upper surface of the first upper insulating film 124 may be exposed through removing of the first lower mask pattern 130. The upper surface of the first upper insulating film 124 may be exposed.

The first lower mask pattern 130 may be removed using, for example, a dry etching process. In the process of removing the first lower mask pattern 130, the first etch stop film 110 that is exposed through the first via-hole 125 may not be substantially etched.

The first lower mask pattern 130 may be a conductive mask pattern. Accordingly, in the etching process for removing the first lower mask pattern 130, a source gas having high etch selectivity for a material included in the first lower mask pattern 130, as compared with a material included in the first insulating film 120, may be used. For example, in the etching process for removing the first lower mask pattern 130, chlorine-based gases, or a combination thereof, may be used.

Figure 4:
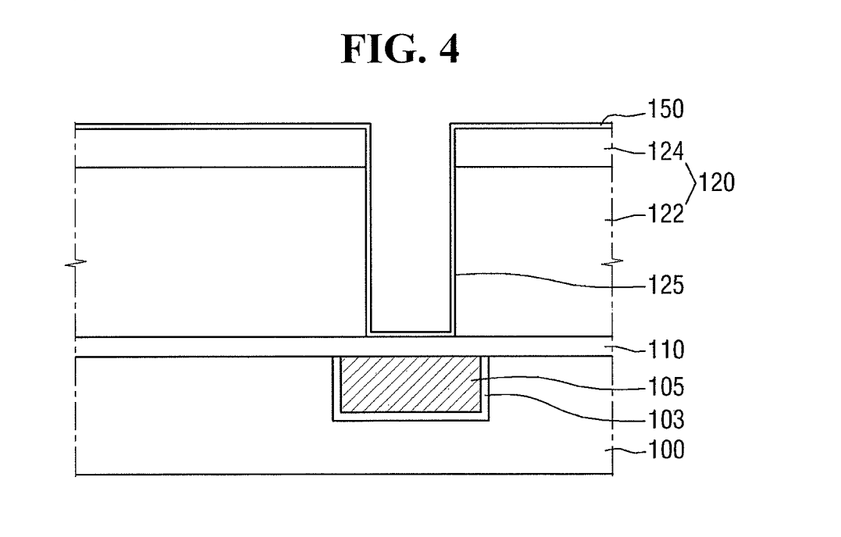

Referring to FIG. 4, a first passivation film 150 may be formed along a side wall of the first via-hole 125. The first passivation film 150 may be formed on not only the side wall of the first via-hole 125 but also upper surfaces of the exposed first etch stop film 110 and the first insulating film 120, that is, the upper surface of the first upper insulating film 124.

The first passivation film 150 may include a carbon-based polymer. The first passivation film 150 may be formed using, for example, a plasma process. In the plasma process for forming the first passivation film 150, a source gas including a precursor having carbon may be used.

Through forming the first passivation film 150 on the first insulating film 120 that is exposed by the first via-hole 125, the plasma damage of the first lower insulating film 122, which may include a low-k material, and the profile bowing of the first via-hole 125 may be reduced. In the process of removing the first etch stop film 110 to be performed thereafter, the first passivation film 150 may serve to protect the first insulating film 120.

Figure 5:
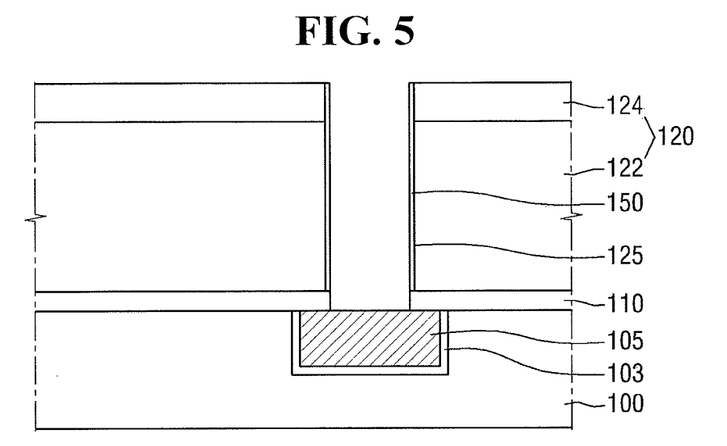

Referring to FIG. 5, through removing a part of the first etch stop film 110 that is exposed by the first via-hole 125, the lower pattern 105 may be exposed. The first etch stop film 110 that does not overlap and is not covered by the first insulating film 120 may be removed.

The first etch stop film 110 may be removed using, for example, dry etching. For the first etch stop film 110 that overlaps the first via-hole 125, a gas having a chemical formula of $CH_xF_y$ may be used, as an example.

It is illustrated that only the first passivation film 150 that is formed on the upper surface of the first upper insulating film 124 is removed in the process of exposing the lower pattern 105 through removing the first etch stop film 110. In other implementations, the first passivation film 150 that is formed on the side wall of the first via-hole 125 may be also removed in the process of removing the first etch stop film 110 that overlaps the first via-hole 125.

In the method for fabricating a semiconductor device according to an embodiment, formation of the first via-hole 125, formation of the first passivation film 150, and exposure of the lower pattern 105 may be continuously performed in-situ. Further, the formation of the first via-hole 125, the formation of the first passivation film 150, and the exposure of the lower pattern 105 may be performed in the same chamber, for example. The formation of the first via-hole 125, the formation of the first passivation film 150, and the exposure of the lower pattern 105 may be performed in different chambers, or may be performed in-situ.

Figure 6:
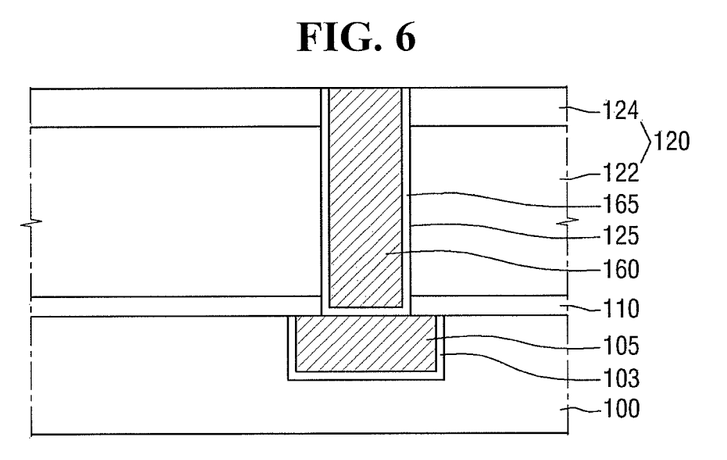

Referring to FIG. 6, a first upper barrier film 165 and a first via 160 may be formed in the first via-hole 125. The first upper barrier film 165 may be conformally formed on the side wall of the first via-hole 125 and the lower pattern 105. The first via 160 may be formed on the first upper barrier film 165 to fill the first via-hole 125. The first via 160 may be electrically connected to the lower pattern 105.

The substrate 100 may be cleaned after the lower pattern 105 is exposed. In the process of cleaning the substrate 100, the first passivation film 150, which may remain on the side wall of the first via-hole 125, may be removed.

After the substrate 100 is cleaned, a first pre-barrier film may be formed along the upper surface of the first insulating film 120, the side surface of the first via hole 125, and the lower pattern 105. The first pre-barrier film may include, for example, a material of Ta, TaN, Ti, TiN, Ru, Co, Ni, NiB, or WN. The first pre-barrier film may be formed using, for example, chemical vapor deposition or sputtering. A first conductive film that fills the first via-hole 125 may be formed on the first pre-barrier film. The first conductive film may also be formed on the upper surface of the first insulating film 125. The first conductive film may include, for example, aluminum (Al), copper (Cu), tungsten (W), or a combination thereof. The first conductive film may be formed using, for example, chemical vapor deposition or electroplating.

Thereafter, through a planarization process, the upper surface of the first insulating film 120 may be exposed. In the planarization process, parts of the first conductive film and the first pre-barrier film may be removed.

Referring to FIGS. 7 to 13, a method for fabricating a semiconductor device according to another embodiment will be described. The duplicate portions to the above-described embodiment will not be repeated or will be briefly described.

FIGS. 7 to 13 illustrate views of intermediate stages of a method for fabricating a semiconductor device according to another embodiment.

Figure 7:
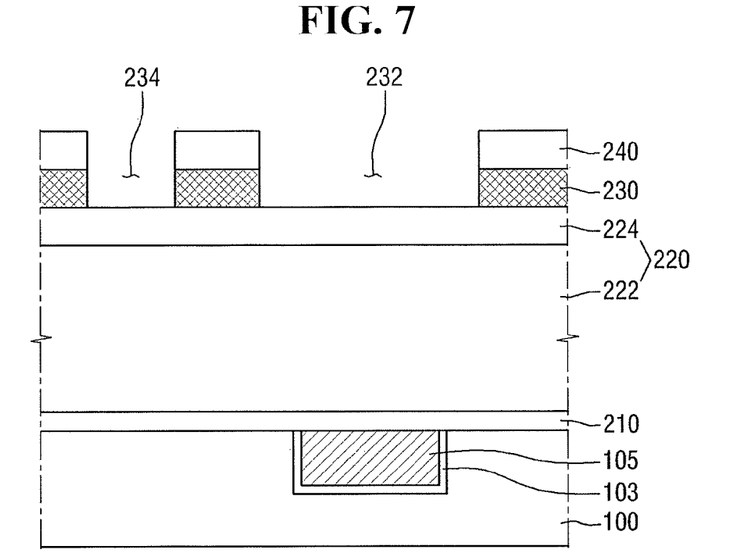
FIGS. 7 to 13 illustrate views of intermediate stages of a method of fabricating a semiconductor device according to another embodiment.

Referring to FIG. 7, an etch stop film 210 and an insulating film 220 may be sequentially formed on a substrate 100 including a lower pattern 105. Mask patterns 230 and 240, which include a first opening 232 and a second opening 234 that are spaced apart from each other, may be formed on the insulating film 220.

The etch stop film 210 and the insulating film 220 may be sequentially formed on the substrate 100, which includes the lower pattern 105. The insulating film 220 may include a lower insulating film 222 and an upper insulating film 224. The etch stop film 210 may include a material having etch selectivity for the insulating film 220. Hereinafter, explanation will be made under the assumption that the etch stop film 210 includes silicon carbonitride (SiCN), the lower insulating film 222 includes a low-k material, and the upper insulating film 224 includes silicon oxynitride (SiON).

The mask patterns 230 and 240 including a lower mask pattern 230 and am upper mask pattern 240 may be formed on the insulating film 220. The lower mask pattern 230 may be, for example, a conductive mask pattern. The upper mask pattern 240 may include, for example, the same material as the upper insulating film 224.

Through the first opening 232 and the second opening 234 included in the lower mask pattern 230, the upper surface of the insulating film 220, that is, the upper insulating film 224, may be exposed.

Figure 8:
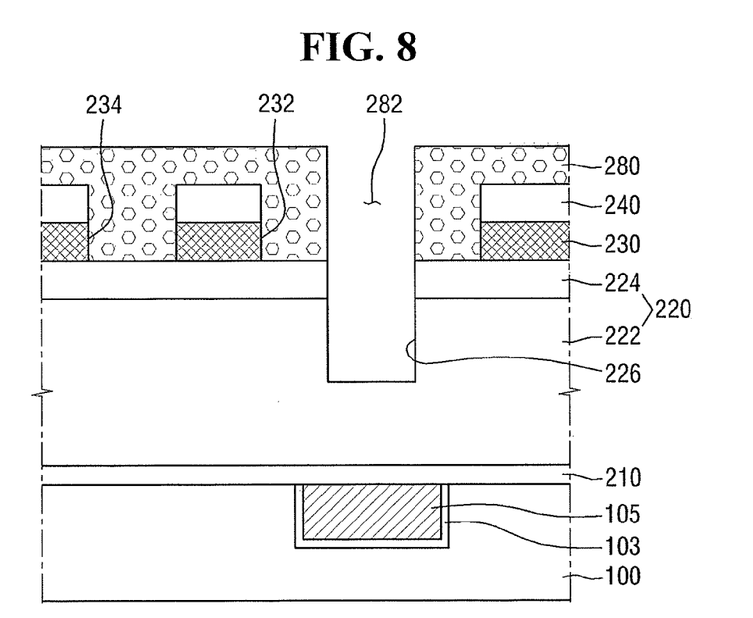

Referring to FIG. 8, a photosensitive film pattern 280 that includes a third opening 282 may be formed on the insulating film 220 and the lower mask pattern 230. A first trench 226 may be formed in the insulating film 220 using the photosensitive film pattern 280 as an etch mask.

A photosensitive film may be formed on the insulating film 220 and the lower mask pattern 230. The photosensitive film pattern 280 may be formed through formation of the third opening 282 in a photo process. A part of the photosensitive film pattern 280 may fill the second opening 234. Accordingly, the second opening 234 may not be exposed by the photosensitive film pattern 280.

The third opening 282 may entirely overlap the first opening 232, and the width of the third opening 282 may be narrower than the width of the first opening 232. The third opening 282 may expose the upper surface of the upper insulating film 224. The third opening 282 may expose only a part of the upper insulating film 224 that is exposed through the first opening 232. The third opening 282 may expose only a part of the upper insulating film 224 that overlaps the first opening 232.

The first trench 226 may be formed in the insulating film 220 using the photosensitive film pattern 280 as an etch mask. The first trench 226 may be formed on a part of the upper surface of the insulating film 220 that overlaps the first opening 232. The first trench 226 may be formed on a part of the upper surface of the insulating film 220 that is exposed through the first opening 232 when the lower mask pattern 230 is formed. The first trench 226 may be formed through removal of parts of the upper insulating film 224 and the lower insulating film 222. The first trench 226 may not expose the etch stop film 210 that is on the lower portion of the insulating film 220. The first trench 226 may be formed using, for example, dry etching.

The upper surface of the insulating film 220 that is not exposed through the third opening 282 may not be etched when the first trench 226 is formed. Accordingly, a step height may exist between the bottom surface of the first trench 226 and the upper surface of the insulating film 220.

A part of the upper surface of the insulating film 220 and the lower mask pattern 230 may be exposed through removal of the photosensitive film pattern 280 after the first trench 226 is formed. When the photosensitive film pattern 280 is removed, the upper mask pattern 240 that is formed on the lower mask pattern 230 may be also removed. In other implementations, the upper mask pattern 240 may be removed in the following process of forming a via-hole (225 in FIG. 9).

Figure 9:
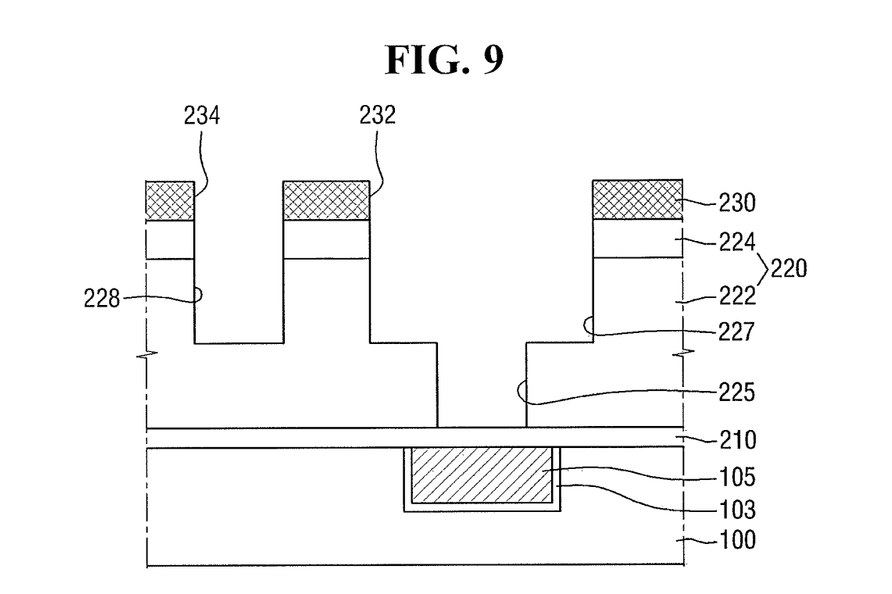

Referring to FIG. 9, a second trench 227, a third trench 228, and the via-hole 225 may be formed in the insulating film 220 using the lower mask pattern 230 as an etch mask.

The second trench 227 may be formed to correspond to the first opening 232 of the lower mask pattern 230, and may not expose the etch stop film 210. The third trench 228 may be formed to correspond to the second opening 234 of the lower mask pattern 230, and may not expose the etch stop film 210. The bottom surface of the second trench 227 and the bottom surface of the third trench 228 may be spaced apart from the etch stop film 210 by substantially the same distance. The second trench 227 and the third trench 228 may be formed through removal of parts of the upper insulating film 224 and the lower insulating film 222.

While the second trench 227 may be formed using the lower mask pattern 230 as an etch mask, the via-hole 225 that exposes the etch stop film 210 may be formed in a region that corresponds to the first trench 226. A step height may exist between the bottom surface of the first trench 226 and the upper surface of the insulating film 220 as shown in FIG. 8. Accordingly, the bottom surface of the first trench (226 in FIG. 8) may be further etched to expose the etch stop film 210 while the second trench 227 is formed. Accordingly, the via-hole 225 may be formed in a region that corresponds to the first trench. The via-hole 225 may be formed on the bottom surface of the second trench 227.

Figure 10:
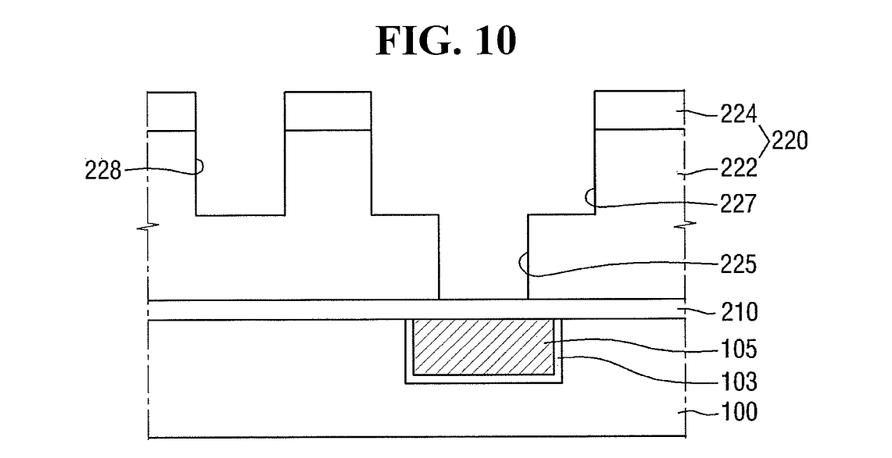

Referring to FIG. 10, the upper surface of the insulating film 220 may be exposed through removal of the lower mask pattern 230. The upper surface of the upper insulating film 224 may be exposed.

The removal of the lower mask pattern 230 may be performed using, for example, a dry etching process. In the etching process for removing the lower mask pattern 230, a source gas having high etch selectivity for a material included in the lower mask pattern 230, as compared with a material included in the insulating film 220, may be used. For example, chlorine-based gases, or a combination thereof, may be used.

Figure 11:
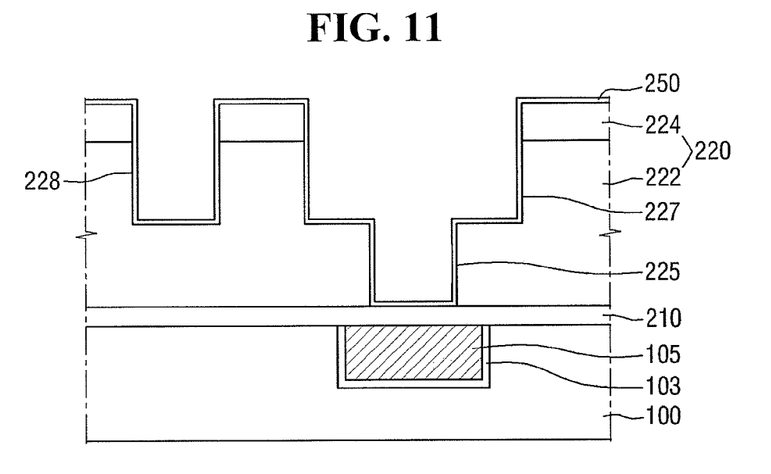

Referring to FIG. 11, a passivation film 250 may be formed along a side wall and a bottom surface of the second trench 227, a side wall and a bottom surface of the third trench, and a side wall of the via hole 225.

The passivation film 250 may include a carbon-based polymer. The passivation film 250 may be formed using, for example, a plasma process.

Figure 12:
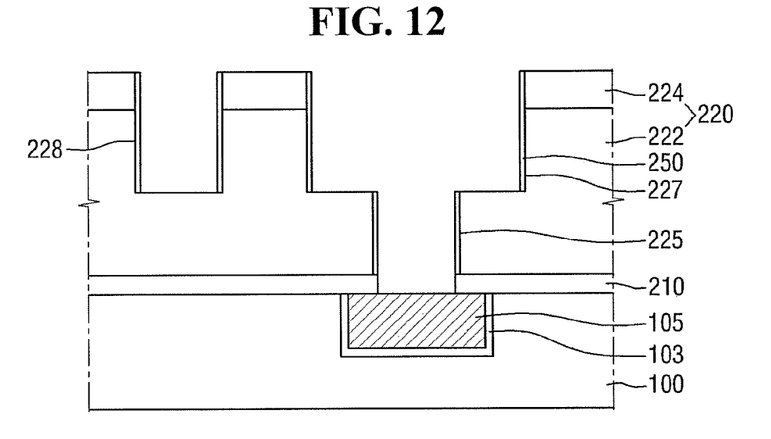

Referring to FIG. 12, through removing the etch stop film 210 that is exposed by the via-hole 225, the lower pattern 105 may be exposed. A part of the etch stop film 210 that is exposed through the via-hole 225 may be removed. A part of the etch stop film 210 may be removed using the upper insulating film 224 as an etch mask.

The etch stop film 210 may be removed through dry etching using, for example, a gas having a chemical formula of $CH_xF_y$, as an example.

It is illustrated that only the passivation film 250 that is formed on the upper surface of the upper insulating film 224 is removed in the process of exposing the lower pattern 105. In other implementations, the passivation film 250 that is formed on the side wall of the second trench 227, the side wall of the third trench 228, and the side wall of the via-hole 225 may be also removed.

In the method for fabricating a semiconductor device according to another embodiment, formation of the first trench 226, formation of the second trench 227, the third trench 228, and the via-hole 225, formation of the passivation film 250, and exposure of the lower pattern 105 may be continuously performed in-situ. Further, the formation of the first trench 226, formation of the second trench 227, the third trench 228, and the via-hole 225, formation of the passivation film 250, and the exposure of the lower pattern 105 may be performed in the same chamber.

The formation of the first trench 226, formation of the second trench 227, the third trench 228, and the via-hole 225, formation of the passivation film 250, and the exposure of the lower pattern 105 may be performed in different chambers, or may be performed in-situ.

Figure 13:
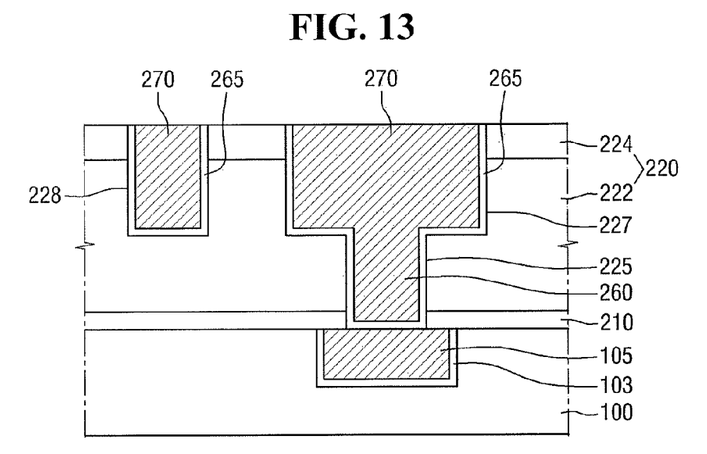

Referring to FIG. 13, a upper barrier film 265 may be conformally formed along the side wall and the bottom surface of the second trench 227 and the side wall of the via-hole 225. The upper barrier film 265 may be conformally formed along the side wall and the bottom surface of the third trench 228.

A via 260 may be formed on the upper barrier film 265 to fill the via-hole 225. Further, an upper metal wiring 270 may be formed through filling the second trench 227 and the third trench 228 on the upper barrier film 265.

The via 260 and the upper metal wiring 270 may be formed at the same level. Here, the term "the same level" refers to formation in the same fabricating process.

The via 260 and the upper metal wiring 270 may include, for example, aluminum (Al), copper (Cu), tungsten (W), or a combination thereof, and may be formed using, for example, chemical vapor deposition or electroplating. The second upper barrier film 265 may include, for example, a material of Ta, TaN, Ti, TiN, Ru, Co, Ni, NiB, or WN, and may be formed using, for example, chemical vapor deposition or sputtering.

The substrate 100 may be cleaned before the via 260 and the upper barrier film 265 are formed. In the process of cleaning the substrate 100, the passivation film 250, which may be present on the side wall of the via-hole 225, the side wall of the second trench 227, and the side wall of the third trench 228, may be removed.

Figure 14:
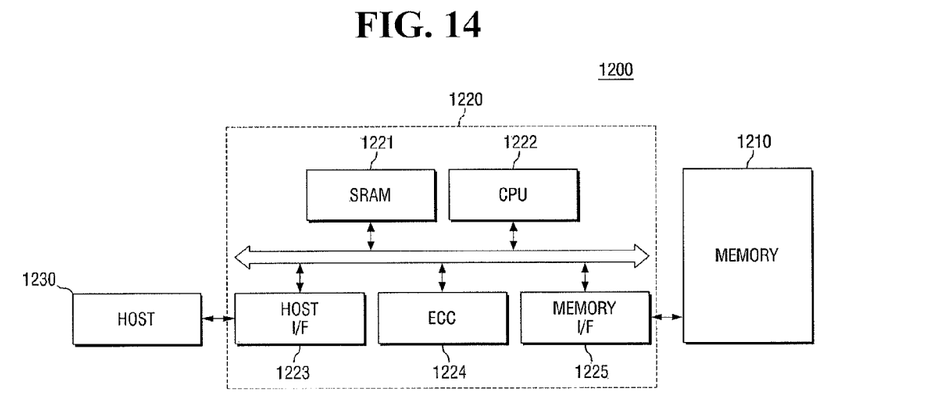
FIG. 14 illustrates a block diagram of a memory card that includes a semiconductor device fabricated by a method of fabricating a semiconductor device according to embodiments.

FIG. 14 illustrates a block diagram of a memory card that includes a semiconductor device fabricated by the method of fabricating the semiconductor device according to embodiments.

Referring to FIG. 14, a memory 1210 that includes a semiconductor device fabricated according to various embodiments may be adopted in a memory card 1200. The memory card 1200 may include a memory controller 1220 that controls data exchange between a host 1230 and the memory 1210. An SRAM 1221 may be used as an operating memory of a central processing unit 1222. A host interface 1223 may include a protocol for the host 1230 to access the memory card 1200 to perform data exchange. An error correction code 1224 may detect and correct errors of data read from the memory 1210. A memory interface 1225 may interface with the memory 1210. The central processing unit 1222 may perform overall control operation related to data exchange with the memory controller 1220.

Figure 15:
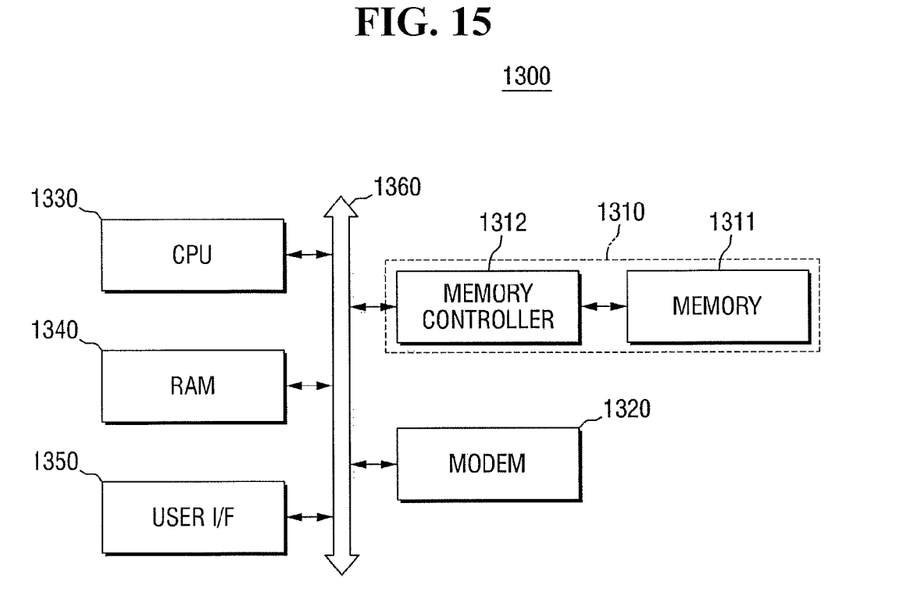
FIG. 15 illustrates a block diagram of an information processing system using a semiconductor device fabricated by a method of fabricating a semiconductor device according to embodiments.

FIG. 15 illustrates a block diagram of an information processing system using a semiconductor device fabricated by the method for fabricating the semiconductor device according to embodiments.

Referring to FIG. 15, an information processing system 1300 may include a memory system 1310 that includes the semiconductor device fabricated according to various embodiments. The information processing system 1300 may include the memory system 1310, a modem 1320, a central processing unit 1330, a RAM 1340, and a user interface 1350, which are electrically connected to a system bus 1360. The memory system 1310 may include a memory 1311 and a memory controller 1312, and may have substantially the same configuration as the memory card 1200 illustrated in FIG. 4. Data that is processed by the central processing unit 1330 and data that is received from an external device may be stored in the memory system 1310. The information processing system 1300 may be applied to a memory card, an SSD, a camera image sensor, or other various chipsets. For example, the memory system 1310 may be configured to adopt the SSD, and in this case, the information processing system 1300 may stably and reliably process large-capacity data.

Figure 16:
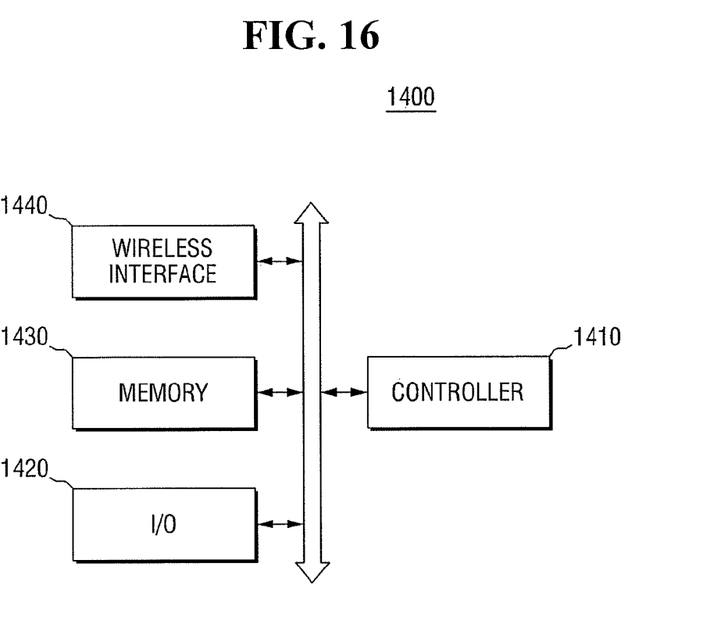
FIG. 16 illustrates a block diagram of an electronic device including a semiconductor device fabricated by a method of fabricating a semiconductor device according to embodiments.

FIG. 16 illustrates a block diagram of an electronic device including a semiconductor device fabricated by the method for fabricating the semiconductor device according to embodiments.

Referring to FIG. 16, an electronic device 1400 may include a semiconductor device fabricated according to various embodiments. The electronic device 1400 may be used in wireless communication devices (for example, a PDA, a notebook, a portable computer, a web tablet, a wireless phone, and/or a wireless digital music player) or various devices that send and receive information in wireless communication environments.

The electronic device 1400 may include a controller 1410, an input/output device 1420, a memory 1430, and a wireless interface 1440. Here, the memory 1430 may include the semiconductor device fabricated according to various embodiments. The controller 1410 may include a microprocessor, a digital signal processor, or a similar processor. The memory 1430 may be used to store commands (or user data) processed by the controller 1410. The wireless interface 1440 may be used to sent and receive data through a wireless data network. The wireless interface 1440 may include an antenna and/or a wireless transceiver. The electronic device 1400 may use, for example, a third generation communication system protocol, such as CDMA, GSM, NADC, E-TDMA, WCDMA, or CDMA2000.

By way of summation and review, for high integration and lower power consumption of a semiconductor chip, an aspect ratio of wiring layers has been increased. Accordingly, research has been conducted for forming a wiring layer having an increased aspect ratio so that the wiring layer does not include defects, such as voids.

In a metallization process for forming an upper wiring through removing a metal hard mask, there is a possibility that a defect may be generated in a lower wiring when the metal hard mask is removed. Embodiments provide a method for fabricating a semiconductor device that can improve a metallization process for forming an upper wiring through removing a metal hard mask that is used in a process for forming the upper wiring before opening of a lower wiring Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. A method for fabricating a semiconductor device, the method comprising:
   sequentially forming an etch stop film and an insulating film on a substrate including a lower pattern;
   forming a conductive mask pattern including a first opening on the insulating film;
   forming a via-hole in the insulating film using the conductive mask pattern as an etch mask, the via-hole exposing the etch stop film;
   removing the conductive mask pattern; and
   forming a passivation film along a side wall of the via-hole after removing the conductive mask pattern.

2. The method as claimed in claim 1, wherein the passivation film includes a carbon-based polymer.

3. The method as claimed in claim 2, wherein the passivation film is formed using a plasma process.

4. The method as claimed in claim 1, further comprising exposing the lower pattern by removing a portion of the etch stop film that overlaps the via-hole after forming the passivation film.

5. The method as claimed in claim 4, wherein removing the conductive mask pattern and exposing the lower pattern are performed in-situ.

6. The method as claimed in claim 4, wherein:
   the insulating film includes an upper insulating film and a lower insulating film, and
   exposing the lower pattern includes removing the exposed etch stop film using the upper insulating film as an etch mask.

7. The method as claimed in claim 4, further comprising:
   conformally forming a barrier layer along the side wall of the via-hole, and
   forming a conductive film that fills the via-hole on the barrier layer.

8. The method as claimed in claim 1, wherein forming the via-hole includes:
   forming a photosensitive film pattern that includes a second opening that entirely overlaps the first opening, the second opening having a width that is narrower than a width of the first opening,
   forming a first trench in the insulating film using the photosensitive film pattern as the etch mask, and
   forming a second trench in the insulating film using the conductive mask pattern as the etch mask after removing the photosensitive film pattern, the second trench not exposing the etch stop film.

9. The method as claimed in claim 8, wherein the via-hole is formed in a region that corresponds to the first trench when the second trench is formed.

10. The method as claimed in claim 8, wherein the passivation film is formed along a side wall and a bottom surface of the second trench and the side wall of the via-hole.

11. The method as claimed in claim 8, wherein:
    the conductive mask pattern includes a third opening spaced apart from the first opening, and
    forming the via-hole includes forming a third trench in the insulating film that corresponds to the third opening when the second trench is formed, the third trench not exposing the etch stop film.

12. The method as claimed in claim 1, wherein the lower pattern includes a conductive material.

13. A method for fabricating a semiconductor device, the method comprising:
    sequentially forming an etch stop film and an insulating film on metal wirings;
    forming a conductive mask pattern including a first opening on the insulating film, the first opening exposing an upper surface of the insulating film;
    forming a first trench in a part of the exposed upper surface of the insulating film, the first trench not exposing the etch stop film;
    forming a second trench and a via-hole in a region that corresponds to the first trench in the insulating film through etching using the conductive mask pattern, the via hole exposing the etch stop film and the second trench not exposing the etch stop film;
    forming a passivation film along a side wall and a bottom surface of the second trench and a side wall of the via-hole after removing the conductive mask pattern; and
    exposing the metal wirings by removing the exposed etch stop film exposed by the via hole after forming the passivation film.

14. The method as claimed in claim 13, wherein forming the passivation film includes forming a carbon-based polymer using a plasma process.

15. The method as claimed in claim 13, wherein removing the conductive mask pattern, forming the passivation film, and exposing the metal wirings are performed in-situ.

16. A method for fabricating a semiconductor device, the method comprising:
providing a substrate including a lower wiring embedded therein;
forming an etch stop film on the substrate such that the etch stop film covers the lower wiring;
forming an insulating film on the etch stop film;
sequentially forming a conductive mask pattern on the insulating film, the conductive mask pattern including a first opening that exposes the insulating film at a location where the insulating film overlaps the lower wiring and a second opening spaced apart from the first opening, the second opening exposing the insulating film at a location where the insulating film does not overlap the lower wiring;
forming a photosensitive film pattern on the insulating film and the conductive mask pattern, the photosensitive film partially filling the first opening to create a third opening overlapping the first opening, the third opening exposing the insulating film and having a narrower diameter than the first opening;
forming a first trench in the insulating film using the photosensitive film pattern as an etch mask, the first trench not exposing the etch stop film;
removing photosensitive film pattern;
forming a second trench corresponding to the first opening of the conductive mask pattern, the second trench not exposing the etch stop film, a third trench corresponding to the second opening of the conductive mask pattern, the third trench not exposing the etch stop film, and a via-hole that extends from the first trench to expose the etch stop film at the location where the insulating film overlaps the lower wiring;
removing the conductive mask pattern; and
forming a passivation layer along a side wall and bottom surface of the second trench, along a side wall and a bottom surface of the third trench, and along a side wall of the via-hole.

17. The method as claimed in claim 16, further including removing the etch stop film exposed in the first trench to expose the lower wiring.

18. The method as claimed in claim 17, further including forming a barrier film conformally along the sidewall and bottom surface of the second trench, along the sidewall and bottom surface of the third trench, and along the side wall of the via-hole.

19. The method as claimed in claim 18, further including forming a via and upper wiring by filling the via-hole, second trench, and third trench with a conductive material.

* * * * *